350-96.11
XR 4,002,997

United States Patent
Thompson

[11] 4,002,997
[45] Jan. 11, 1977

[54] INTEGRATED OPTICAL CIRCUIT

[75] Inventor: George H. B. Thompson, Harlow, England

[73] Assignee: International Standard Electric Corporation, New York, N.Y.

[22] Filed: Sept. 4, 1975

[21] Appl. No.: 610,342

[30] Foreign Application Priority Data
Oct. 29, 1974 United Kingdom ............ 46741/74

[52] U.S. Cl. ..................... 331/94.5 H; 331/94.5 C; 350/96 WG; 357/18
[51] Int. Cl.$^2$ .......................................... H01S 3/19
[58] Field of Search ............ 331/94.5; 350/96 WG; 357/18

[56] References Cited
UNITED STATES PATENTS

| | | | |
|---|---|---|---|
| 3,758,875 | 9/1973 | Hayashi | 331/94.5 |
| 3,868,589 | 2/1975 | Wang | 331/94.5 |

Primary Examiner—William L. Sikes
Attorney, Agent, or Firm—John T. O'Halloran; Thomas M. Marshall; Richard A. Menelly

[57] ABSTRACT

An integrated optical circuit provides a heterostructure injection laser wherein the optical resonator is spaced apart from the active optical region of the laser. One embodiment of the invention provides a second low loss waveguiding layer at a different level from the active layer for convenient optical connections between the laser and the optical circuit.

6 Claims, 5 Drawing Figures

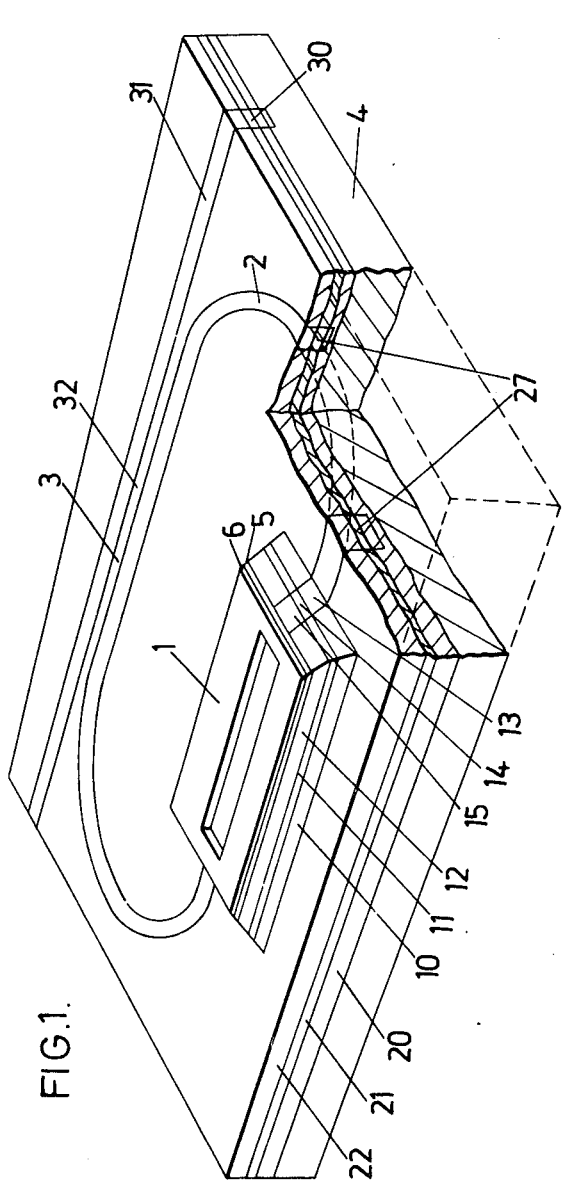
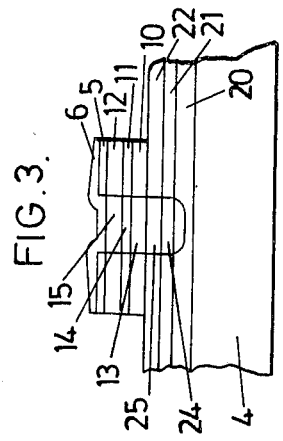
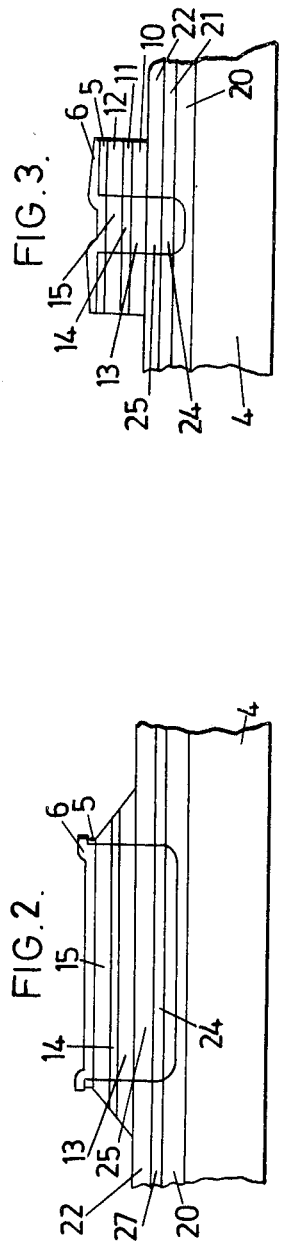

INTEGRATED OPTICAL CIRCUIT

FIELD OF THE INVENTION

This invention relates to integrated optical circuits.

BACKGROUND OF THE INVENTION

Appropriate semiconductors form useful materials for constructing integrated optical circuits, since a variety of optical components can be fabricated in them. There is, however, a problem in incorporating the heterostructure semiconductor injection laser in an integrated circuit since in the normal design of the laser it is necessary to use two boundary surfaces of the semiconductor to provide the optical feedback. Such external surfaces are not easily available in an integrated arrangement and the design versatility is hence considerably reduced.

SUMMARY OF THE INVENTION

According to the present invention there is provided an integrated optical circuit including a heterostructure injection laser whose optical resonator is spaced from the active optical gain providing region of the laser.

The invention may be embodied in a multilayer heterostructure laser device in which a second low loss waveguiding layer is introduced into the multilayer heterostructure at a different level from the active layer of the laser. This second layer provides a convenient medium for constructing optical connections between components in an integrated assembly. For this purpose, and for the purpose of providing lateral guiding for the laser resonator, stripe guides can be fabricated within the layer by converting a region to higher refractive index either by proton bombardment or by suitable distribution of dopants or by varying the semiconductor composition by selective epitaxy.

GENERAL DESCRIPTION OF THE INVENTION

The coupling between the active layer of the laser and the lower waveguiding layer can be supplied by the natural coupling which occurs between two phase coherent waves in adjacent guides. When the phase coherence is adequate a so called "characteristic coupling length" exists such that over a length $l$ optical power in one guide couples entirely into the other guide. Over a distance $2l$ the power switches over to the second guide and then back to the original guide. The phase coherence between the two guides is adquate if, in the absence of coupling, the waves would move out of step over a distance $l$ by less than about one tenth of their wavelength. For poorer phase coherence only a fraction of the power transfers to the second guide although it all returns again to the first guide. An analysis of the situation when the second guide possesses optical gain shows that the behavior is similar, but that the power transferred back to the first guide is greater than the power originally transferred from it. Also for given coupling the length $l$ is slightly increased. If the phase coherence is not correct not all the power is retrieved from the second guide.

According to the above reasoning satisfactory coupling can be achieved if the active layer of the laser is made to lie adjacent to the passive guide and if the length of the active layer is chosen to be $2l$ or a multiple of $2l$, ($l$ depending on the proximity of the two guides). With such an arrangement the path of optical power traveling down the resonator guide is as follows. As the power skirts the region where the active layer lies it couples fully to the active layer where it is amplified and then couples back fully to the resonator guide. The cycle is completed over a distance $2l$. It is desired that the optical energy should continue propagating only in the resonator guide then the active layer or the coupling should be discontinued at the point of complete transfer, otherwide the cycle will be repeated. Under these circumstances the way in which the active layer is terminated is not a particular significance. This eases the problems of fabricating the device, since it is not necessary to provide a high precision termination to the active layer as in the case of the orthodox laser. The criterion is that no coupling should exist between the two guides outside the relevant length. This may be achieved either by destroying the phase coherence between the two guides, or by physically removing the active guiding layer.

If the coupling length is not an exact multiple of $2l$ then a certain amount of power remains in the active layer at its termination. To avoid unnecessary losses this could be totally reflected. Phase interactions with the transmitted wave would result, which would modify the frequency response of the passive resonator. The limiting case would occur if the length of the coupling region were $(2m + 1)l$, where $m$ is an integer, in which case the main resonance would occur between the reflecting ends of the active layer and not in the passive resonator. Under certain circumstances the interaction of the two resonances could be put to advantage, but this would then impose specific requirements on the reflectors in the active layer. For the form of operation which is proposed here with a coupling length of a multiple of $2l$, where the insensitivity to the active layer terminations can be exploited, it can be preferable to incorporate deliberately some optical loss at the active layer terminations so that there is no possibility of high Q resonance should a situation arise where the coupling length differed considerably from $2ml$.

The separation of the active region from the resonator means that the optical loss per unit length in the resonator can be made quite small. One effect of this is that the resonator may be made longer than normal without impairing the laser performance. (In a normal laser the whole resonator has to be pumped by the current. Hence, the total current becomes excessive if the resonator is too long, and most of the additional current produces no useful light output since the light is absorbed in the length of the resonator which it has to transverse before exiting.) A long resonator can be more easily terminated at an external surface. A long resonator may be looped into a complete circuit of an acceptable curvature which does not result in excessive radiation loss. A complete circuit can provide the feedback and no additional reflecting surfaces are required. Instead of having only a single active optical gain producing region, there may be several spaced along the length of the resonator. This means that unwanted heat generated in the active regions may be dispersed over a larger area, thereby reducing the overall temperature rise. Another feature is that parts of the resonator are more readily accessible for further optoelectronic functions to be incorporated, such as frequency stabilization and variable output coupling. The coupling between the active layer and the resonator is to a certain extent self-optimizing since the mode that is selected is the one which has the highest coupling efficiency. Hence, the coupling between the two layers of the device is more easily performed within the resonator than external to the resonator.

For high peak power use this layout also has the advantage that with a looped resonator the laser resonator contains no vulnerable GaAs surface which can be destroyed by the high peak light intensity. The final exit point of the light lies outside the optical resonator and can be designed to spread the optical intensity in ways which are not possible in the active optical gain providing region of a laser.

There follows a description of an integrated optical circuit embodying the invention in a preferred form. The description reference to the accompaying drawings in which:

BRIEF DESCRIPTION OF THE DRAWINGS

FIG. 1 is a part sectioned perspective view of the integrated optical circuit of this invention;

FIG. 2 is a longitudinal and sectional view of the integrated optical circuit of FIG. 1 at the active optical gain providing region;

FIG. 3 is a traverse sectional view of the device of FIG. 1 at the active optical gain providing region;

DESCRIPTION OF THE PREFERRED EMBODIMENT

Figure 4:
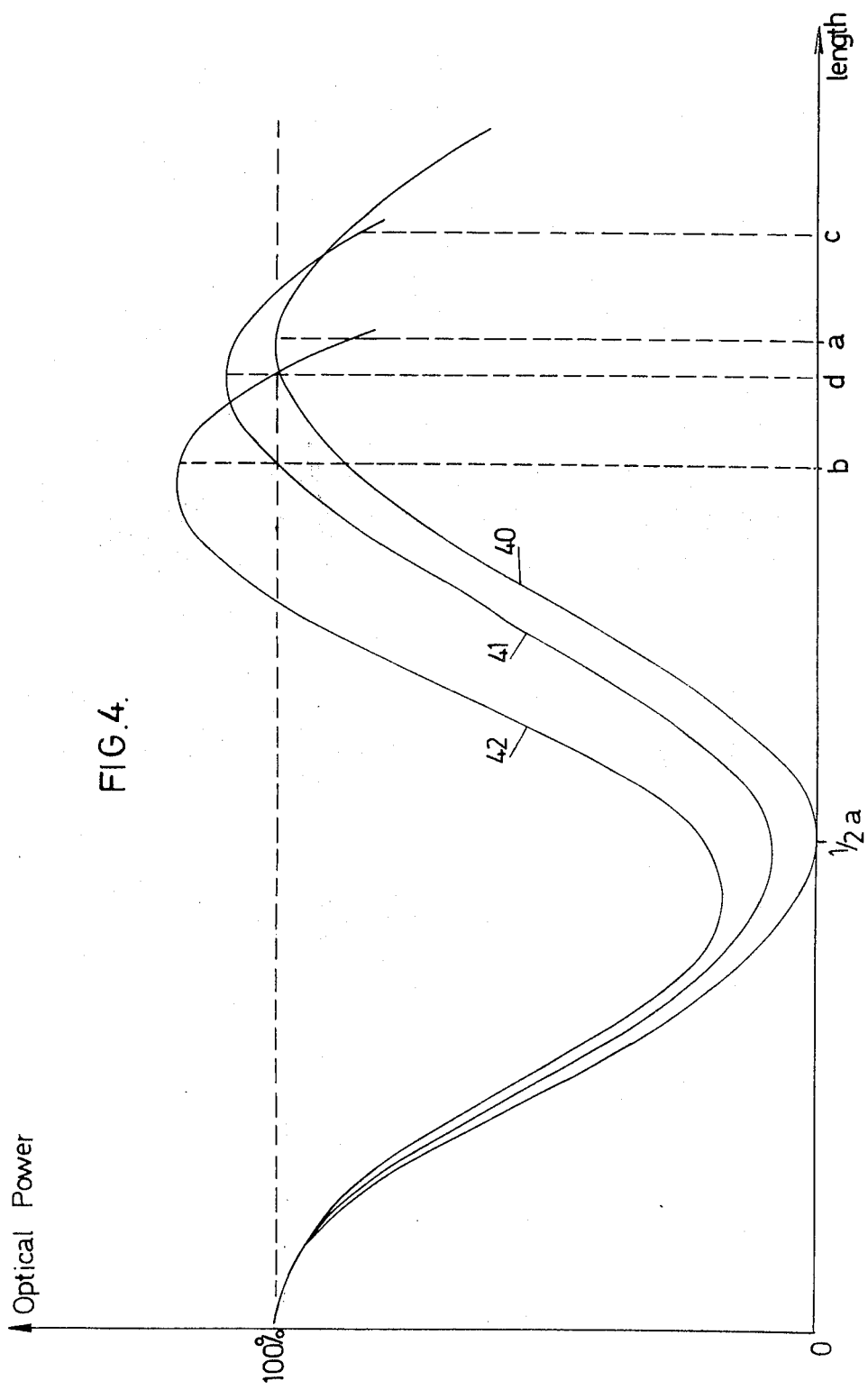
FIG. 4 is a graph showing the effect of departures from a nominal optimum length of active region for the device of FIG. 1.

The integrated optical circuit depicted in FIGS. 1, 2 and 3 is a multilayer heterostructure device fabricated in $Ga_{1-x}Al_xAs$, the major components of which consist of a large mesa region 1 containing the active optical gain providing region, a laser resonator 2 and a directional coupler 3.

The multilayer structure is grown on a GaAs substrate 4. The first layers to be grown are three layers 20, 21 and 22 in the middle one of which is formed the resonator 2, and the directional coupler 3. Layers 20 and 22 are made of larger band-gap material (greater aluminum concentration, and hence lower refractive index) than layer 21 so as to provide guiding in the direction normal to their planes for light propagating within layer 21.

The next three layers of the structure do not extend over the whole surface in the completed device, but merely cover a short section of the resonator. These layers comprise a layer 10 whose band gap is typically matched with that of layer 21 and must be less than that of layer 22, a thin layer 11 having the smallest band-gap of all the grown layers, and a layer 12 whose band gap is typically matched with that of layers 20 and 22. As a result of layer 11 having the smallest band-gap, light generated in this layer is not significantly attenuated by the other grown layers. The greater band-gap of layers 12 and 22 provide guiding in a direction normal to their planes for light propagating in layers 10 and 11.

All the layers are made of n-type material so that diffusion of a p-type dopant, such as zinc, into a strip may be used to reduce the electron carrier concentration within the strip. One effect of reducing the electron carrier concentration is to increase the refractive index. Therefore, at the sides of the strip, there is change in refractive index which affords a measure of optical guiding in the lateral direction for light propagating in the strip.

In this embodiment the resonator 2 is in the form of a loop whose minimum radius of curvature is about 1-1.5 mm, and therefore the lateral guiding on the bends has to be quite strong. This necessitates the use of a relatively high carrier concentration for layer 21 of about $3 \times 10^{18}$ cm$^{-3}$.

The p-type diffusion is required not only to produce lateral guiding, but also to produce a p-n junction that can be forward biased for the injection of minority carrier into the active region. For this reason the doping of layers 10, 11 and 12 is made less than that of layer 22. Layer 22 is typically provided with a carrier concentration of $3 \times 10^{18}$ cm$^{-3}$ while layers 10, 11 and 12 have a carrier concentration of about 1 to $2 \times 10^{18}$ cm$^{-3}$.

Initially the layers 10, 11 and 12 cover the same area as the underlying layers 20, 21 and 22, but the majority of these upper layers are etched away during manufacture to leave only the large mesa region indicated generally at 1. Before this etching stage is reached, layer 12 is covered with a masking layer 5 through which is etched a long rectangular window, typically 3 μm wide, extending almost the whole length of that portion which is to form the mesa region 1. A p-type dopant material is diffused through this window to convert the regions 13, 14 and 15 of layers 20, 11 and 12 to p-type material. This diffusion must not convert the conductivity type of region 25 of layer 22, but it must significantly reduce the electron carrier concentration of region 24 of layer 21.

This diffusion produces the required refractive index change in region 24, 13 and 14 to produce optical guiding in the lateral direction, and it also produces a p-n junction at the boundary between regions 25 and 13.

The structure of the mesa region 1, comprising layers 10, 11 and 12 with their regions 13, 14 and 15, may be seen to be very similar to that of a double heterostructure laser, with the junction between layer 10 and layer 22 forming the second heterojunction. In double heterostructure lasers the low band-gap material of the active region may be spaced from either or both of the high band-gap material layers by layers of intermediate band-gap material. This provides a possibility of improved efficiency by making a partial separation of the means of optical confinement and carrier confinement.

The layer 10 performs a similar function in this structure, and, though not essential, has the advantage that it may be constructed so as to achieve a match between the optical guiding characteristics of the region 24 and those of the active region comprising, in this instance, the combination of regions 13 and 14.

The structure of the mesa region 1 is however different from that of a laser at its ends. The ends of this structure are made optically absorbing instead of reflecting. A contact layer 6 is deposited on the mask 5 to make contact through the window with the underlying region 15. This contact layer does not make contact with the extreme ends of the region 15. As a result of the absence of carrier injection the extreme ends of the regions 13 and 14 remain optically absorbing. Absorption in the ends can also be induced by proton bombardment. Feedback at the ends can also be reduced by using a suitable etch, such as a diffusion limited etch, to chamfer the side of the mesa region 1.

Optical guiding in the direction normal to the layer 21, for light propagating in the optical resonator 2, is provided by the refractive index difference between that of layer 21 and that of its adjoining layers 20 and 22. Optical guiding in the lateral direction is provided by locally raising the refractive index of the resonator 2 by reducing its electron carrier concentration.

In the part of the laser resonator lying underneath the mesa region 1 the reduction in electron carrier concentration is required in the region 24, and is provided by the p type diffusion previously referred to. For the remainder of the resonator the reduction may conveniently be achieved by proton bombardment to render a stripe 27 of layer 21 semi-insulating. This proton bombardment is extended a short distance into the mesa up to the ends of the p-doped stripe. An advantage of using proton bombardment is that it can be used to reduce the electron carrier concentration of region 27 from a maximum value to a minimum and hence give the strongest possible lateral guide. This contrasts with the p type diffusion which gives less strong lateral guiding because it leaves the region 24 $n$ type in order to leave region 25 $n$ type.

With an initial carrier concentration of about $3 \times 10^{18}$ cm$^{-3}$ in layer 21 the lateral guiding in region 27 is sufficiently strong for the resonator 2 to be constructed with bends having a radius of curvature of not less than about 1 to 1.5 mm. This enables the resonator 2 to take the form of a closed loop of relatively small size, and eliminates the need for the provision of reflecting surfaces. At the bends the light is automatically concentrated into a ribbon about 2.5 $\mu$m wide with its transverse distribution compressed against the outside boundary of the stripe.

The vertical spacing between the two guiding layers and the thickness of the layers and their composition determine the coupling, and hence the coupling length $l$. The total legnth L of the active region must be approximately equal to 2 or a multiple thereof. The required spacing between the layers is about 1 $\mu$m for a value of $2l$ of, for instances, 200 $\mu$m, guiding layer thicknesses of 0.2 $\mu$m and 25% steps in AlAs content between layer 21 and layers 20 and 22. (Larger steps in AlAs content and thicker guiding layers require reduced spacing.)

To obtain correct coupling between the two layers the phase constants of the waves in the two layers must be adjusted to be equal to an accuracy of better than $\lambda_2/2l$ where $\lambda_2$ is the wavelength of the guided waves. This must apply under the appropriate operating conditions for the active unit at a high injected carrier concentration. The injected carriers increase the wavelength by a factor of up to about 1.0025. Such a variation is sufficient to desynchronize the two waves appreciably and vary the coupling to a considerable extent. However, provided it is arranged that synchronization is reasonable under operation conditions a means for slight variation of synchronization can be put to advantage, as will be explained below.

The coupling between the two guides and the characteristic coupling length $l$ is sensitively dependent on the spacing d between the two guiding levers — $\delta l/l \simeq 7 \delta d/d$ for the case considered. It is therefore unlikely that layer growth can be sufficiently accurately controlled to provide a given value of $l$ within appropriate tolerances to suit a given predetermined physical coupling length L of the active region. Some alleviation of the difficulty may be achieved in manufacture by adjusting the physical coupling length L to suit the precise measured dimensions and compositions of any given growth. However, it is also possible to benefit from the fact that slight lack of synchronization between the waves in the two layers decreases $l$ without substantially affecting the total amount of power transfer. In this condition a certain proportion of the stimulated emission is wasted and exits directly from the end of the active region but this can be reduced to a proportion of the order to $\delta l/l$ where $\delta l$ is the adjustment which must be made to the true phase matched value of $l$ to make it an exact factor of L/2. This adjustment becomes less as L is made a greater multiple of $l$. L should be so chosen in relation to the phase synchronization that the coupling tends to draw itself into tune as the current is increased. The situation will then be stable.

If the phase synchronization is exact the stable situation occurs when L is slightly less than a multiple of $2l$, as can be deduced from FIG. 4. The graph of FIG. 4 depicts, as a function of distance the variation of optical power propagating in the resonator under the active region. FIG. 4 deals in particular with the situation where L is approximately equal to $2l$, but the curves can readily be extrapolated to show the situation where L is approximately equal to some multiple of $2l$. Curve 40 depicts the situation when sufficient current drive is applied to the active region to render it transparent to the propagating light. Under these conditions the resonator and active region are assumed to behave like a lossless coupler. All the optical power is transferred from the resonator to the active region over a coupling length $l=\frac{1}{2}a$, and then over a further distance of $\frac{1}{2}a$ it is all transferred back to the resonator region. If the physical coupling length L is equal to $a$ the active region does not contribute any loss to the resonator, but it does if L is too short, for instance equal to $b$, or if L is too long, for instance equal to $c$.

In order to get the structure to lase, the active region has to be driven harder so that it is not merely transparent, but is able to provide sufficient optical gain to offset the circuit loss in the resonator. This drive condition is represented by curve 41. The peak in curve 41 is above that of curve 40 by an amount equal to the circuit loss of the resonator. The increased current drive modifies the optical properties of the active region. Previously the optical properties were such that there was phase synchronization between light propagating in the active region and that propagating in the resonator. The effect, therefore, of this modification is to shorten slightly the characteristic coupling length $l$ so that under the increased current drive $2l$ is equal to $d$. This shortening of the characteristic coupling length acts in conjunction with the gain to increase the amount of light which is transferred back to the resonator in the case of an active region having a physical coupling length $a$. However, in the case of an active region having a physical coupling length $c$, the two effects acts in opposition, and the result is that the increased drive results in even less light being transferred back to the resonator. In fact the shortening of the characteristic coupling length makes the light transfer slightly less than adequate for laser action even in the case of an active region having a physical coupling length $a$.

Normally the current drive is increased beyond the lasing threshold so as to be able to extract power from the laser. This further increased current drive condition is represented by curve 42. Under these conditions the characteristic coupling length has been further shortened until now it is approximately equal to ½b. Therefore a physical coupling length b is near the optimum. In fact, however, since the gradient of curve 42 is negative at b, the drive is just too strong for a physical coupling length b: because the condition has just been reached where increased drive is producing a decrease in optical power transfer to the resonator.

In the case of an inexact match of physical synchronization between the waves propagating in the active region and those in the resonator the analysis is more complicated if the mismatch is in the sense in which increased current drive reduces the mismatch. Under these conditions of reducing mismatch the characteristic coupling length will lengthen, but then, on passage through the matching condition the characteristic coupling length will begin to shorten again.

In the region of the resonator 2 lying at a distance from the large mesa the resonator lies close to a second optical guide 30, so that the two guides are optically coupled and co-operate to form the optical coupler 3. For this guide 30, the greater band gap of layers 20 and 22 provide guiding in a direction normal to the planes of these layers. The guide 30 is formed by proton bombardment, or p-type doping of a stripe 31 to a depth extending through layer 21, thereby providing guiding in a lateral direction.

Since the directional coupler is formed in semiconductive materials its coupling constant can be made electrically controllable by the method described in the Specification accompanying our co-pending U.S. patent application Ser. No. 594,480, filed July 9, 1975 (G. H. B. Thompson-17), to which attention is directed. A preferred construction is essentially similar to that described in that specification with particular reference to its FIG. 2. This involves forming both the resonator 2 and the guide 30 by proton bombardment. The region 32 of layer 22 lying between these guides is rendered p-type by doping, thus forming a p–n junction between the guides. The application of a reverse bias across this p–n junction produces a change or refractive index on the n-type side of the junction in the depletion region as a result of the extraction of electrons from that region. The electro-optic effect will also be present since there is an electric field across the depletion region. By means of these two effects the coupling between the two guides is rendered electrically controllable.

Figure 5:
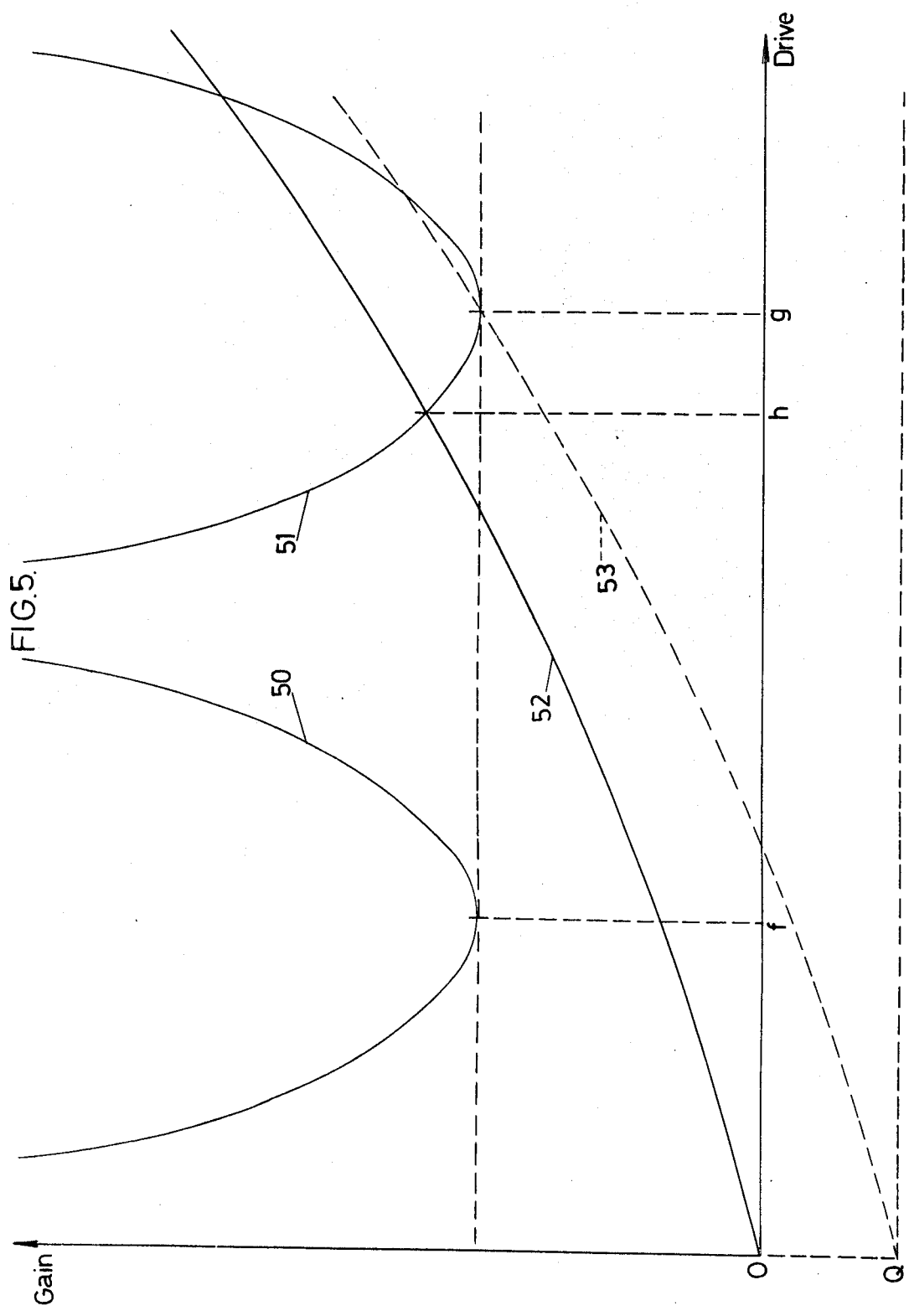
FIG. 5 is a graph showing the effect of modifying the coupling coefficient of a directional coupler incorporated in the laser resonator of the device of FIG. 1.

An advantage of this control may be appreciated by reference to FIG. 5. FIG. 5 is a graph depicting at 50, 51, how the optical gain necessary for laser action varies as a function of current drive in the active region. On the same graph is plotted at 52 the variation of gain provided by the active region expressed as a function of current drive.

Each of the curves 50 and 51 has a minimum at drive levels $f$ and $g$ respectively. At these drive levels the physical coupling length L is an exact multiple of twice the characteristic coupling length $l$. At these particular drive levels the optical power that is coupled into the active region is entirely coupled out again back into the resonator. The ordinate of this minima is therefore equal to the circuit loss of the resonator. On either side of the positions the gain requirement for laser action increases because an increasing proportion of the circulating light is wasted through being coupled out of the resonator into the active region without being coupled efficiently back in again.

When the drive is increased to level $f$ the active region gain is too small to overcome the circuit, and thus there is no laser action. As the gain is further increased the characteristic coupling length $l$ shortens until the physical coupling length L becomes approximately equal to the next higher multiple of $2l$. This is characterized by the curve 51. The lasing threshold is reached when the drive reaches level $h$. At this level of drive the active region gain is greater than the circuit loss but the additional gain is lost at the ends of the active region as a result of the physical coupling length $c$ not being an exact multiple of twice the characteristic coupling length $l$.

This problem can be overcome by modifying the coupling of the directional coupler 3 so as to increase the proportion of light coupled out of the resonator 2. This increase augments the circuit loss of the resonator. On FIG. 5 it is conveniently represented by a shift of the origin in the negative $-y$ direction. The curve 52 is moved with the shift of the origin, but curves 50 and 51 are not displaced. Altering the coupling coefficient of the directional coupler 3 to provide an additional resonator circuit loss is represented in the graph by the intercept OQ shifts the origin from O to Q. The new active region gain curve is then given by curve 53. At drive level $g$ this curve intersects curve 51 at its minimum, thus indicating that the laser threshold is reached under the optimum condition of the physical coupling length L being an exact multiple of twice the characteristic coupling length $l$.

In another embodiment (not illustrated) a second loop resonator is formed in layer 21 by proton bombardment. Part of this second loop lies alongside part of the primary resonator loop 2 so as to provide optical coupling between the loops. The two loops are of different optical path length so that they co-operate to act as a mode filter.

A further modification involves providing lateral guiding by p-type diffusion instead of proton bombardment for at least a portion of one of the loops in addition to the portion lying under the large mesa 1. This diffusion is designed to provide a p–n junction in the vicinity of a portion of one of the loops which can be reverse biased. The application of a reverse bias modifies the optical path length of the loop concerned, thereby affording the facility of electrical tuning of the laser. This tuning may be incorporated in a feedback loop to provide frequency stabilization.

It is to be noted that the necessary optical guiding for the resonator can be achieved by known guiding configurations other than the particular one described above with reference to the preferred embodiments. One such other guiding configuration relies on providing a strip region of greater thickness in the higher refractive index layer; another involves the use of a high refractive index layer of uniform thickness which is covered with a strip region of lower refractive index material.

It is to be understood that the foregoing description of specific examples of this invention is made by way of example only and is not to be considered as a limitation on its scope.

What is claimed is:

1. An integrated optical circuit comprising a heterostructure injection laser having an optical resonator and an active optical gain region, said optical resonator being spaced apart from said optical gain region and comprising a closed loop.

2. The circuit of claim 1 further including directional coupler means for extracting optical power from the loop, said optical resonator being in optical proximity with said coupler means.

3. The circuit of claim 2 wherein said directional coupler includes an electro-optic modulator for electrically controlling said coupler.

4. The circuit of claim 1 further including a second optical resonator coupled with said optical resonator so as to form a mode filter.

5. The circuit of claim 4 wherein said optical resonators include variable optical path lengths and wherein either of said optical resonators transverses said electro-optic modulator wherein said path lengths become electrically controllable.

6. The circuit of claim 4 wherein said second optical resonator comprises a closed loop.

* * * * *